United States Patent [19]

Wildi et al.

[11] Patent Number: 4,862,242
[45] Date of Patent: Aug. 29, 1989

[54] SEMICONDUCTOR WAFER WITH AN ELECTRICALLY-ISOLATED SEMICONDUCTOR DEVICE

[75] Inventors: Eric J. Wildi, Clifton Park; Tat-Sing P. Chow, Schenectady, both of N.Y.

[73] Assignee: General Electric Company, Schenectady, N.Y.

[21] Appl. No.: 807,612

[22] Filed: Dec. 11, 1985

Related U.S. Application Data

[63] Continuation of Ser. No. 558,405, Dec. 5, 1983, abandoned.

[51] Int. Cl.[4] .............. H01L 27/04; H01L 29/80; H01L 29/90; H01L 29/34
[52] U.S. Cl. .............................. 357/48; 357/22; 357/13; 357/86; 357/52
[58] Field of Search .............. 357/22, 52, 86, 13, 357/48, 91

[56] References Cited

U.S. PATENT DOCUMENTS

| | | | |
|---|---|---|---|
| 4,117,507 | 9/1978 | Pacor | 357/86 |
| 4,233,617 | 11/1980 | Klaasen et al. | 357/13 |
| 4,277,794 | 7/1981 | Nuzillat | 357/48 |
| 4,292,642 | 9/1981 | Appels et al. | 357/22 |
| 4,376,286 | 3/1983 | Lidow et al. | 357/91 |
| 4,409,606 | 10/1983 | Wagenaar et al. | 357/22 |
| 4,422,089 | 12/1983 | Vaes et al. | 357/22 |
| 4,494,134 | 1/1985 | Wildi et al. | 357/48 |
| 4,809,021 | 5/1978 | Sato et al. | 357/20 |

FOREIGN PATENT DOCUMENTS 52-00186 1/1977 Japan.

OTHER PUBLICATIONS

Appels, High Voltage Thin Layer Devices (RESURF Devices), IEDM Washington, Dec. 1979, pp. 238-241.

Primary Examiner—Rolf Hille
Assistant Examiner—Robert P. Limanek
Attorney, Agent, or Firm—Robert Ochis; James C. Davis, Jr.; Marvin Snyder

[57] ABSTRACT

A semiconductor wafer having a substrate with an epitaxial layer thereon includes a semiconductor device electrically isolated from the substrate as well as from any other devices in the wafer by electrical isolation structure comprising semiconductor material. The semiconductor device can accordingly be operated at high voltage with respect to the wafer substrate. The isolation structure in one form of the wafer comprises an N+ high voltage tub included in the wafer and a P+ ground region situated in the expitaxial layer, adjoining the substrate, and horizontally circumscribing the N+ high voltage tub and being spaced therefrom by a minimum layer extent of a portion of the epitaxial layer that is of N conductivity type. The N+ high voltage tub comprises an N+ high voltage region situated in the epitaxial layer and surrounding a device region in which the semiconductor device is at least partially contained and, further, an N+ buried layer underlying the N+ high voltage region and the entirety of the device region.

11 Claims, 6 Drawing Sheets

SEMICONDUCTOR WAFER WITH AN ELECTRICALLY-ISOLATED SEMICONDUCTOR DEVICE

This application is a continuation of application Ser. No. 558,405, filed 12/5/83, and now abandoned.

BACKGROUND OF THE INVENTION

The present invention relates to a semiconductor wafer incorporating an electrically-isolated semiconductor device and, more particularly, to such a wafer wherein the electrical isolation of the semiconductor device is achieved through the use of semiconductor material integral with the wafer.

Semiconductor wafers having electrically isolated semiconductor devices contained therein are useful in that they permit the semiconductor devices to be operated at high voltage with respect to a substrate of the wafer that is typically at a ground (i.e., reference) potential. The semiconductor wafer, accordingly, can also integrally contain semiconductor devices that are operated at low voltage, such as signal level devices for processing low voltage information signals. This type of semiconductor wafer is, consequently, versatile in regard to the types of electrical functions it can perform.

A prior art semiconductor wafer incorporating an electrically-isolated semiconductor device achieves such electrical isolation by means of dielectric material that spaces the semiconductor device from a substrate of the wafer as well as from any further semiconductor devices in the wafer. Unfortunately, the fabrication of such wafers is complex and costly due to the incorporating of dielectric material to achieve electrical isolation. The use of semiconductor material for achieving the desired electrical isolation would result in a semiconductor wafer that is easier to fabricate and thus less costly than the prior art dielectric isolation approach. It would thus be desirable to provide a semiconductor wafer in incorporating an electrically isolated semiconductor device, with the electrical isolation achieved through the use of semiconductor material.

OBJECTS OF THE INVENTION

Accordingly, it is an object of the invention to provide a semiconductor wafer incorporating an electrically isolated semiconductor device with such electrical isolation achieved through the use of semiconductor material.

A further object of the invention is to provide a semiconductor wafer of the foregoing type that can be fabricated using existing semiconductor device processing technology.

Another object of the invention is to provide a semiconductor wafer including an electrically isolated semiconductor device, which wafer can be fabricated economically due to a reduced number of fabrication steps.

SUMMARY OF THE INVENTION

The foregoing objects are achieved in a semiconductor wafer, which, in a preferred form, includes a P-substrate with an epitaxial layer thereon of generally N-semiconductor material (the designations "P" and "N" referring to the conductivity type of the respective semiconductor material and the "−" thereafter referring to a low dopant concentration). A semiconductor device is included in the wafer and is electrically isolated by a semiconductor, high voltage isolation means from the substrate as well as from any further semiconductor devices in the wafer. The semiconductor high voltage isolation means includes a high voltage tub included in the wafer and containing the semiconductor device. A P+ ground region adjoining the substrate (the "+" referring to a high dopant concentration) horizontally circumscribes the high voltage tub and is spaced therefrom by a minimum, predetermined lateral extent of a portion of the N− epitaxial layer, the lateral dimension of which is selected to achieve high voltage isolation between the high voltage tub and the P+ ground region.

The high voltage tub comprises an N+ high voltage region and an N+ buried layer. The N+ high voltage region extends downwardly at least partially through the N− epitaxial layer from an upper surface thereof and horizontally surrounds a device region in which the semiconductor device is at least partially contained. The N+ buried layer underlies the N+ high voltage region and the entirety of the device region.

The semiconductor device may comprise any low voltage device that typically has a voltage breakdown rating of less than about 50 volts.

BRIEF DESCRIPTION OF THE DRAWINGS

The features of the invention deemed to be novel are defined in the appended claims. The invention itself, however, as to both organization and method of operation, together with further objects and advantages thereof, will be better understood by referring to the following description in conjunction with the accompanying drawing figures, in which:

DESCRIPTION OF A PREFERRED EMBODIMENTS

Figure 1:
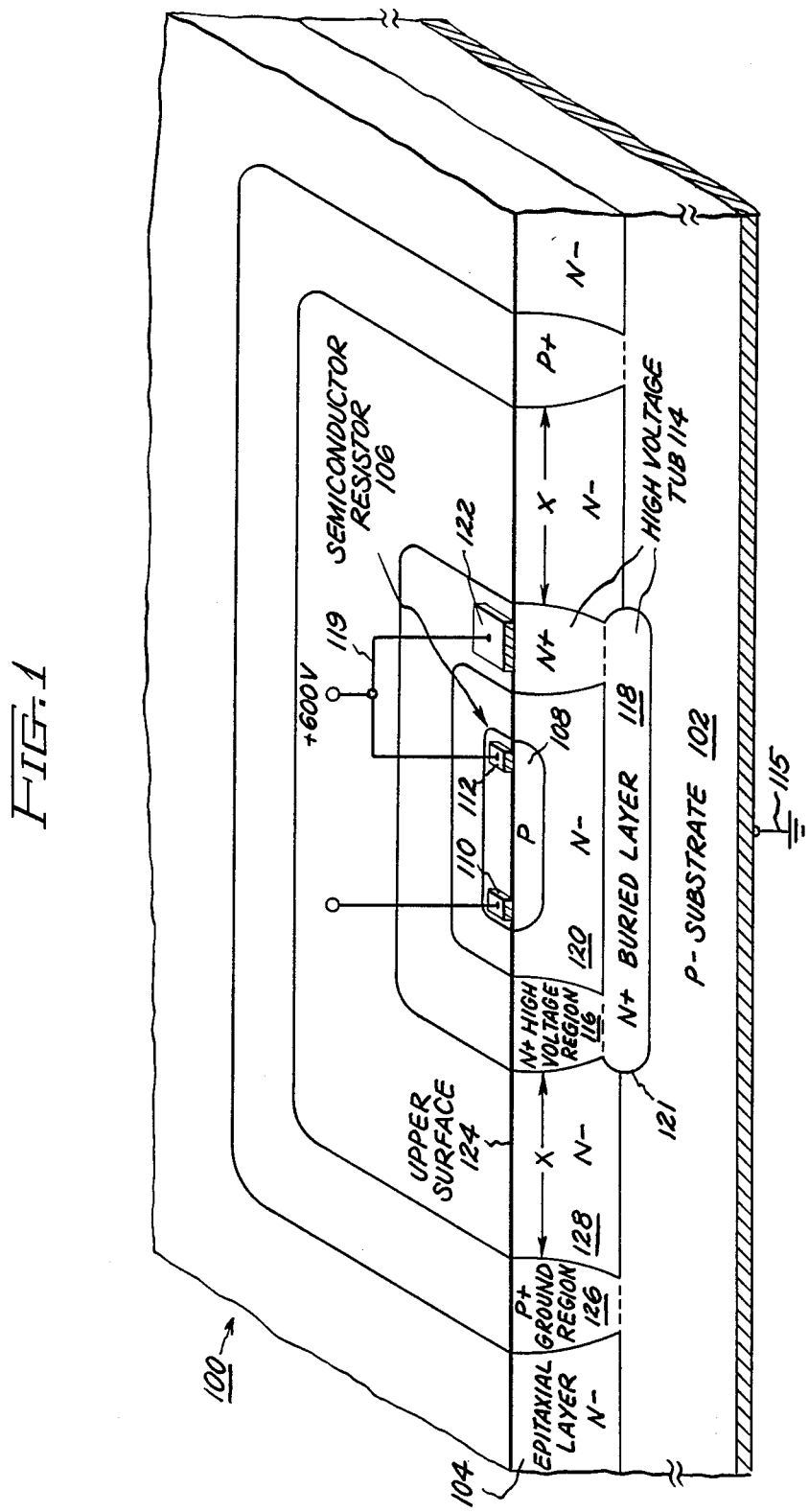
FIG. 1 is a schematic, tridimensional view, partially in cross section, of a portion of a semiconductor wafer containing a semiconductor resistor.

Turning to FIG. 1, there is shown a semiconductor wafer 100, preferably comprising silicon semiconductor material, although other semiconductor materials such as gallium arsenide could be suitably used. Wafer 100 includes a substrate 102 with an epitaxial layer 104 preferably grown thereon and generally doped to a light concentration of N conductivity type dopant. Formed within epitaxial layer 104 is a low voltage semiconductor device 106 comprising, by way of example, a semiconductor resistor of simple construction for clarity in illustrating the features of the present invention. Resistor 106 comprises elongated P semiconductor region 108 and a pair of resistor terminals 110 and 112 situated atop P region 108 at the left and right sides thereof, respectively, as depicted in FIG. 1. Semiconductor resistor 106 is a low voltage device that is typically operated below about 50 volts between its terminals 110 and 112.

In accordance with the present invention, semiconductor resistor 106 is contained within a high voltage tub 114, the upper portion of which comprises N+ high voltage region 116 and the lower portion of which comprises N+ buried layer 118. High voltage tub 114 is adapted to be operated at high voltage, such as the illustrated voltage level of 600 volts that is referenced to a ground or reference potential schematically depicted at 115. Low voltage semiconductor resistor 106 may be operated at the same voltage as N+ high voltage tub 114 through electrical connection 119 between resistor terminal 112 and an electrical contact 122 atop N+ high voltage region 116. Alternatively, N+ high voltage region 116 may be referenced to a high voltage that is independent of the voltage on resistor 106 except for being within about 50 volts of the respective voltages on resistor terminals 110 and 112. With N+ high voltage region 116 referenced in this manner, electrical connection 119 is omitted.

The high voltage region 116, horizontally circumscribes a device region 120 of epitaxial layer 104 that contains semiconductor resistor 106. Buried layer 118 underlies N+ high voltage region 116 and the entirety of device region 120 and electrically isolates semiconductor resistor 106 from P− substrate 102, which is at ground 115 potential, by preventing depletion region reach-through between resistor 106 and substrate 102. This is accomplished by N+ buried layer 118 since it is highly-doped and accordingly resists depletion of electrons vertically therethrough. In this connection, P− substrate 102 has a low dopant concentration, typically of about $10^{14}$ dopant atoms per cubic centimeter where N+ high voltage tub is operated at 600 volts, for example, in order to prevent voltage breakdown between buried layer 118 and substrate 102. Such voltage breakdown would arise from the large electric field existing near vertically curved portion 121 of the P-N junction between layer 118 and substrate 102 if the dopant concentration of substrate 102 were too high.

N+ high voltage region 116 extends into epitaxial layer 104 from an upper surface 124 of wafer 100 and, as depicted in FIG. 1, adjoins N+ buried layer 118. For achieving electrical isolation of N+ high voltage tub 114, N+ high voltage region 116 is laterally spaced by a minimum, predetermined distance X from a P+ ground region 126 that is at ground 115 potential due to its integral connection to P− substrate 102. The distance X is typically about 20 microns where N+ high voltage tub 114 is operated at voltages on the order of 60 to 70 volts while typically being about 60 microns when tub 114 is operated at voltages on the order of 600 to 700 volts. P+ ground region 126 extends vertically through epitaxial layer 104 and horizontally circumscribes high voltage tub 114.

The thickness and dopant concentration of portion 128 of N- epitaxial layer 104 between regions 116 and 126 (where the foregoing distance X is measured) are preferably selected to maximize the voltage at which N+ high voltage region 116 may be operated. Techniques for accomplishing this may be found in, for example, an article by J. A. Apples and H. M. J. Vaes, "High Voltage Thin Layer Devices (RESURF Devices)", Proceedings of the 1979 IEEE International Electron Device Meeting, pages 238–241, as well as in an article by S. Colak, B. Singer and E. Stupp "Design of High-Density Power Lateral DMOS Transistors," Proceedings of the 1980 IEEE Power Electronics Specialists Conference, pages 164–167.

Semiconductor wafer 100 advantageously may contain further semiconductor devices (not shown), each within a respective high voltage tub (not shown), without danger of electrical shorting occurring as a result of semiconductor breakdown between semiconductor resistor 106 when operated at high voltage and the other devices. Additionally, although not illustrated, semiconductor wafer 100 may be modified by including therein more than one adjacent semiconductor device within high voltage tub 114, and, optionally, by separating such adjacent semiconductor devices separated by an N+ region (not shown) that adjoins N+ high voltage region 116 in such a manner as to divide high voltage tub 114 into more than one tub section. Such a multi-sectioned tub advantageously would eliminate any parasitic currents between adjacent devices.

Electrode 122 on semiconductor wafer 100 is illustrated schematically and in an actual embodiment of the invention may comprise, for example, a continuous electrode (not shown) atop N+ high voltage region 116 that circumscribes device region 120 or a periodic electrode (not shown) circumscribing device region 120. Such a continuous or periodic electrode 122 may be desirable to maintain a uniform potential throughout N+ high voltage tub 114 that otherwise might not occur when, for example, P resistor region 108 injects hole current into N− device region 120 as a result of transient voltages on resistor terminals 110 and 112. Fabrication details for electrode 122 as well as the other electrodes on wafer 100 (i.e., resistor electrodes 110 and 112) is within the purview of those skilled in the art.

In fabricating semiconductor wafer 100, N+ buried layer 118 is implemented, prior to the growth of epitaxial layer 104 thereover, by doping the upper surface of P− substrate 102 with suitable N conductivity type dopant. This doping procedure is preferably carried out by the technique of ion implantation, although other doping techniques may be employed. The selection of a suitable net dopant concentration for buried layer 118 involves a compromise. The higher the net dopant concentration of N+ buried layer 118, the greater the extent to which such layer 118 diffuses upwardly and laterally into portion 128 of epitaxial layer 104 during the subsequent formation of layer 104. The upward diffusion of buried layer 118 reduces the maximum operating voltage of resistor 106 with respect to the potential of N+ high voltage tub 114. The lateral diffusion of buried layer 118 reduces the distance X and thus lowers the maximum operating voltage of N+ high voltage tub 114. The lower the net dopant concentration of N+ buried layer 118, on the other hand, the higher the parasitic current loss into P− substrate 102 that flows in the inherent, bipolar transistor, P-N-P structure in wafer 100, comprising P resistor region 108, the combination of N− epitaxial portion 120 and N+ buried layer 118, and P− substrate 102.

In fabricating epitaxial layer 104, it is preferable to grow an epitaxial layer of semiconductor material that is very lightly doped to N conductivity type and thereafter to introduce further N conductivity type dopant atoms into layer 104, as by ion implanation, to obtain a desired, final dopant concentration. In semiconductor wafer 100, such introduction of further impurities after epitaxial growth has taken place occurs in N− portion 128 of epitaxial layer 104.

In fabricating N+ buried layer 118, a typical net charge or dopant concentration for such layer 118 where N+ high voltage tub 114 is designed to operate at 600 volts, for example, is $10^{15}$ dopant atoms for each square centimeter of buried layer 118 as considered in a horizontal plane, regardless of the vertical height of layer 118. N+ high voltage region 116 is suitably provided by diffusion of dopant atoms through upper surface 124 of epitaxial layer 104. The dopant concentration of region 116 is preferably of a sufficiently high value that electrode 122 thereon forms an ohmic (or non-rectifying) contact therewith. Alternatively, a shallow N+ region (not shown) below electrode 122 may be provided to assure that the desired ohmic contact exists. A typical surface dopant concentration of N+ high voltage region 116 is $5 \times 10^{19}$ atoms per cubic centimeter where N+ high voltage tub 114 is designed to operate at 600 volts, for example. P+ ground region 126 suitably has a surface dopant concentration above about $5 \times 10^{19}$ dopant atoms per cubic centimeter. Fabrication details for semiconductor resistor 106, including a suitable geometry and dopant concentration therefor, will be readily ascertainable by those skilled in the art.

Figure 2:
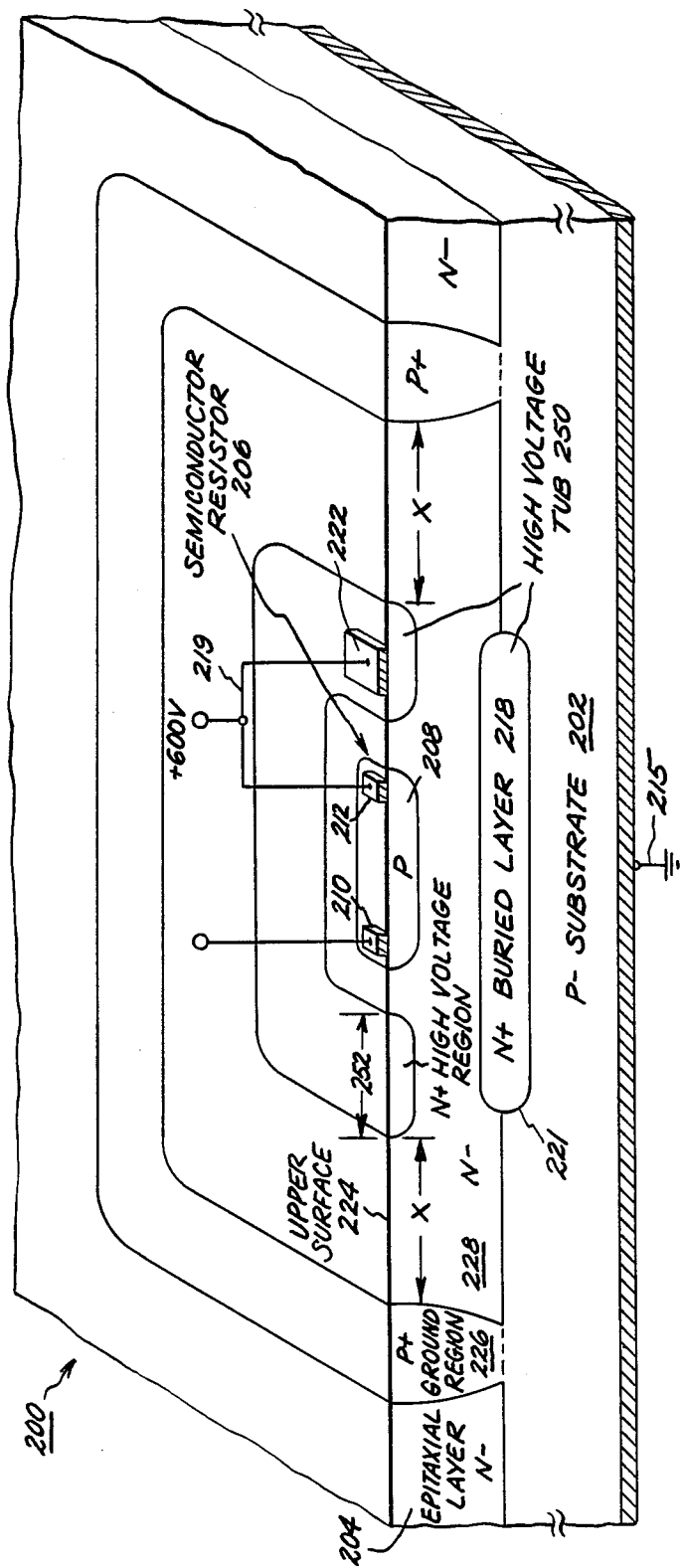
FIG. 2 is a view similar to FIG. 1 depicting a semiconductor resistor at high voltage contained in a portion of a modified semiconductor wafer.

Turning now to FIG. 2, there is shown a semiconductor wafer 200 that is essentially similar to semiconductor wafer 100 (FIG. 1) except for the inclusion in wafer 200 of a different high voltage tub 250. Accordingly, like parts as between semiconductor devices 100 and 200 have identical reference numerals except for the first digit of the reference numerals. High voltage tub 250 comprises an N+ buried layer 218, suitably identical to N+ buried layer 118 of wafer 100, and a shallow, N+ high voltage region 252 that differs from N+ high voltage region 116 of wafer 100 in that it does not fully extend from upper surface 224 of epitaxial layer 204 to N+ buried layer 218. The advantage of fabricating semiconductor 200 with a shallow N+ high voltage region 252 resides in the fact that the required number of doping steps can be reduced where there are other shallow N+ regions in wafer 200 that can be formed simultaneously with N+ high voltage region 252. Region 252 further differs from region 116 of wafer 100 by typically being larger in lateral extent 252 so as to insure adequate electrical isolation between semiconductor resistor 206 and P+ ground region 226. The spacing X between N+ region 252 and P+ region 226 is determined in the same manner as described above for selecting distance X in semiconductor wafer 100.

The semiconductor wafers described below could alternatively incorporate the modified high voltage tub 250 of semiconductor wafer 200, but are illustrated for simplicity only with high voltage tub 114 of semiconductor wafer 100 (FIG. 1).

Figure 3:
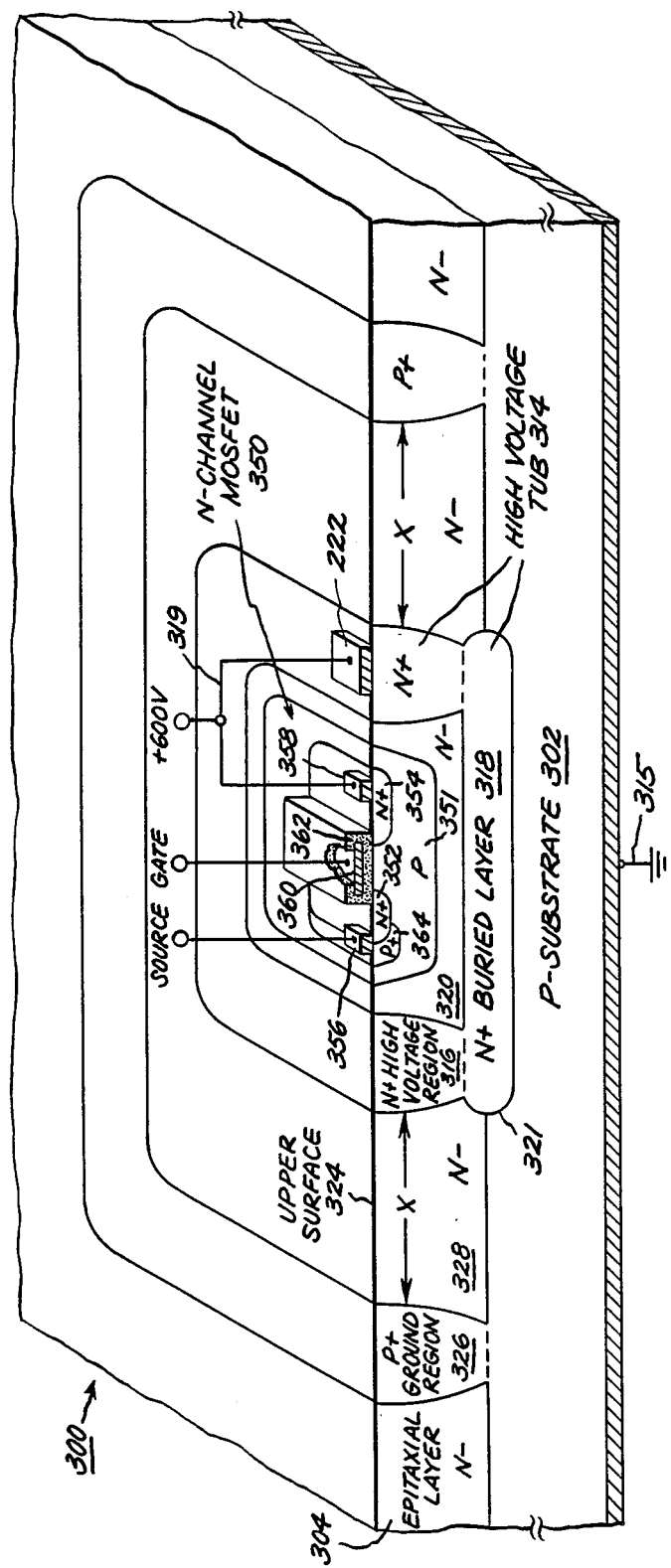
FIG. 3 is a view similar to FIG. 1 depicting an N-channel MOSFET at high voltage contained in a semiconductor wafer.

Turning to FIG. 3, there is shown a semiconductor wafer 300 containing an N-channel metal-oxide-semiconductor field effect transistor (MOSFET) 350 within a high voltage tub 314. Wafer 300 is essentially similar to wafer 100 (FIG. 1) except for containing a different semiconductor device in its high voltage tub 314. Accordingly, like parts as between wafers 100 and 300 have identical reference numerals except for the first digit of the reference numerals. N-channel MOSFET 350 comprises P channel threshold control region 351 extending into device region 320 and N+ source and drain regions 352 and 354, respectively, extending into P channel threshold control region 351. Source and drain electrodes 356 and 358, respectively, are situated atop source and drain regions 352 and 354, respectively. Gate 360 of MOSFET 350 is shown as surrounded by insulation 362 and comprises a conductive, refractory material such as polysilicon that is highly doped to either P conductivity type or N conductivity type. A conventional metal gate (not shown) may be employed in lieu of refractory gate 360, if desired. In order to reference the threshold voltage of gate 360 at which an inversion channel (not shown) within P+ channel threshold control region 351 is formed under gate 360, P+ region 364 is provided between source electrode 356 and P channel threshold control region 351 and electrically shorts together electrodes 356 and region 351. Such inversion channel conductivity interconnects source and drain regions 352 and 354, respectively, so as to switch MOSFET 350 into a conductive state.

The fabrication of N-channel MOSFET 350 within high voltage tub 314 can advantageously be accomplished using conventional field effect transistor (FET) fabrication techniques.

Semiconductor wafer 300 may be modified by incorporating the alternative high voltage tub 250 of the FIG. 2 embodiment in lieu of the illustrated high voltage tub. This would permit the shallow N+ high voltage region of high voltage tub 250 to be formed at the same time as the source and drain regions 352 and 354, respctively, of N-channel MOSFET 350, thereby reducing the required number of fabrication steps.

Figure 4:
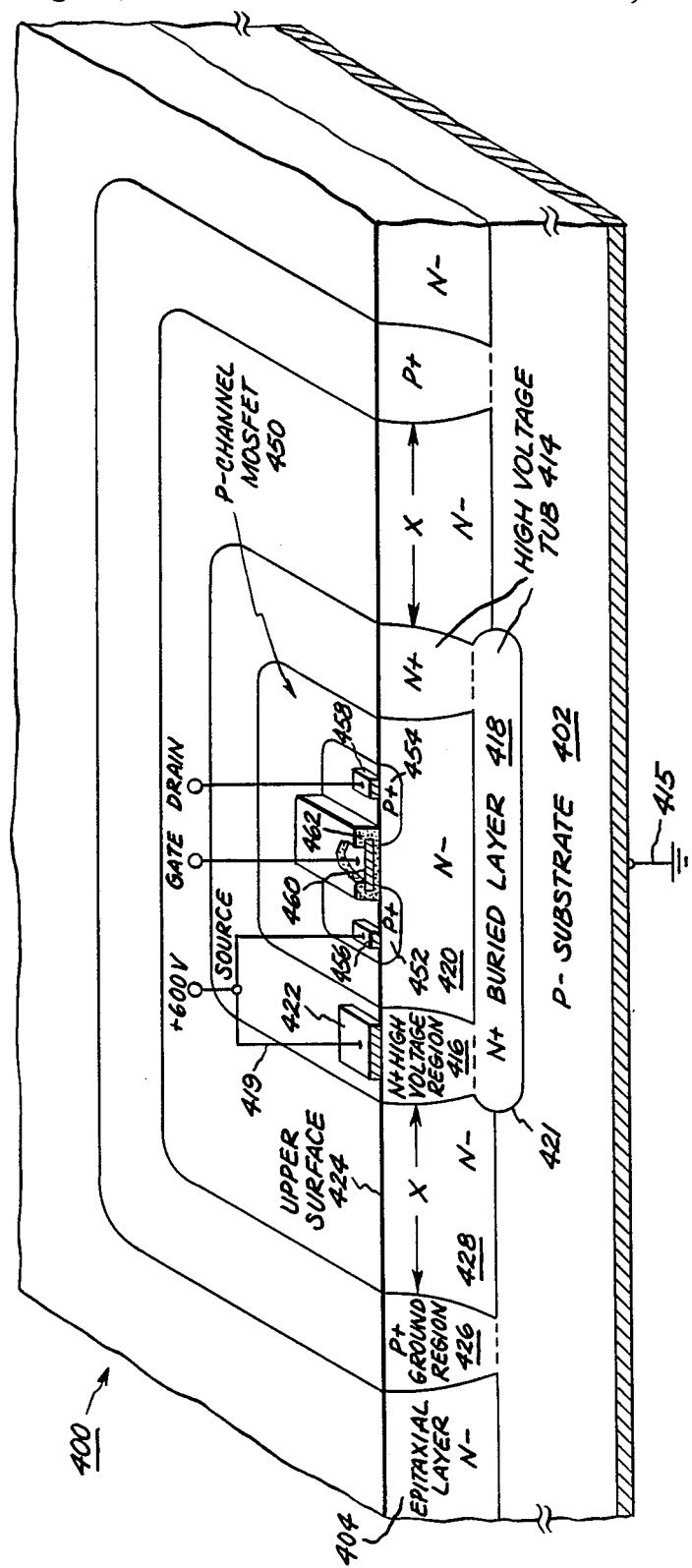
FIG. 4 is a view similar to FIG. 1 depicting a P-channel MOSFET at high voltage contained in a semiconductor wafer.

A semiconductor wafer 400 of the present invention is illustrated in FIG. 4 and contains a P-channel MOSFET 450 within a high voltage tub 414. Wafer 400 is essentially similar to wafer 100 (FIG. 1) except for containing a different semiconductor device in its high voltage tub 414. Accordingly, like parts as between these wafers have identical reference numerals except for the first digit of the reference numerals. P-channel MOSFET 450 comprises P+ source region 452 and P+ drain region 454 extending into device region 420 from upper surface 424. Source and drain electrodes 456 and 458, respectively, are situated atop source and drain regions 452 and 454, respectively. Gate 460 of conductive, refractory material such as polysilicon that is highly doped with either N or P conductivity type impurities is surrounded by insulation 462 and disposed above device region 420, which serves as a channel threshold control region for MOSFET 450. A conventional metal gate (not shown) may be employed in lieu of refractory gate 460, if desired. Source electrode 456 of MOSFET 450 is preferably electrically shorted to electrode 422 so as to reference the potential of N− device region 420 to source region 452, via N+ high voltage region 416. The threshold bias voltage on gate 416 necessary to form an inversion channel in N− device region 420, beneath gate 460, is thus established at a known level.

In semiconductor wafer 400, device region 420 preferably comprises semiconductor material of the same dopant concentration as portion 428 of epitaxial layer 404, whereby the fabrication of P-channel MOSFET 450 does not require a special processing step to form the base region, but, instead, utilizes existing device region 420 as its channel threshold control region. The further structural features of P-channel MOSFET 450 can advantageously be constructed using conventional FET fabrication techniques.

Figure 5:
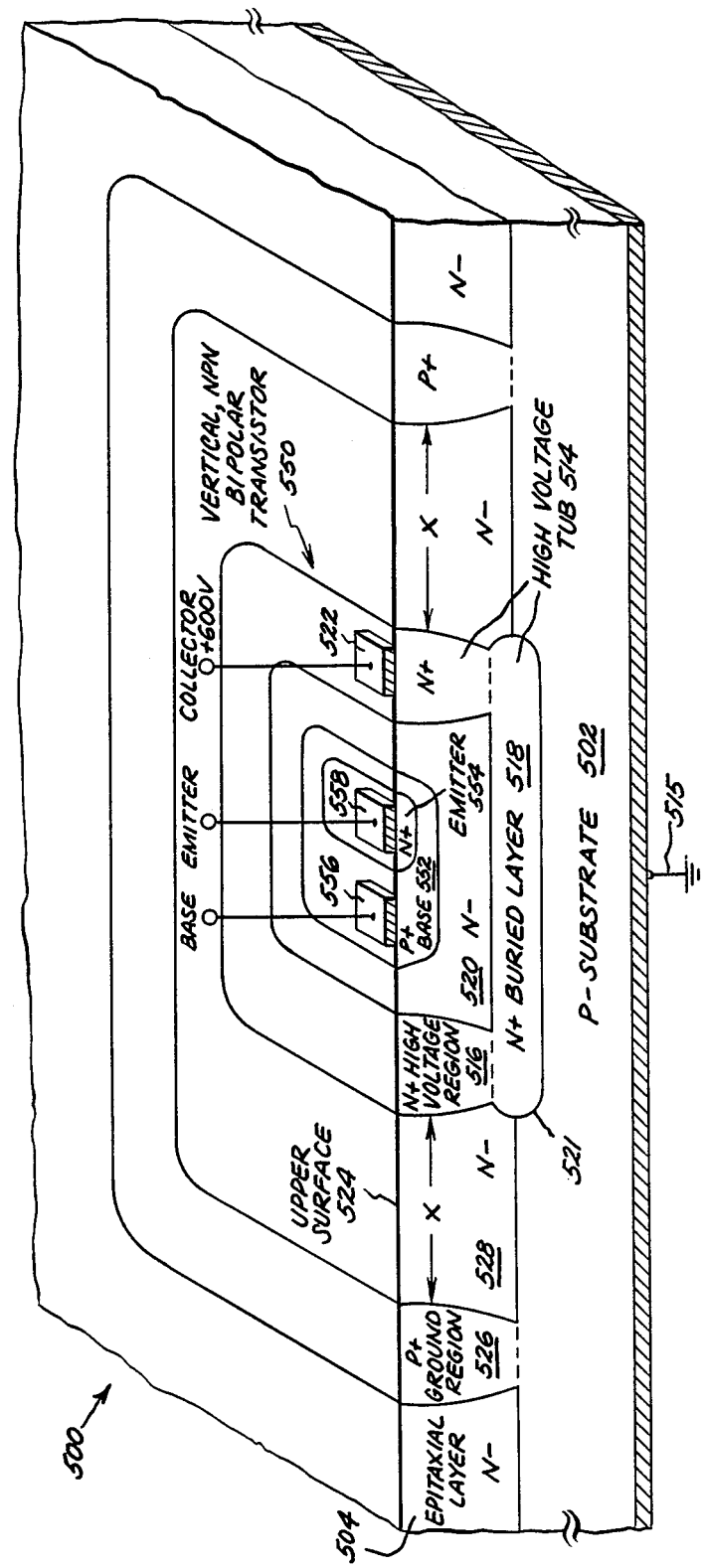
FIG. 5 is a view similar to FIG. 1 depicting a vertical, NPN bipolar transistor at high voltage contained in a semiconductor wafer.

FIG. 5 illustrates a semiconductor wafer 500 incorporating a vertical, NPN bipolar transistor 550 but otherwise being essentially similar to semiconductor wafer 100 (FIG. 1). Accordingly, like parts as between wafers 100 and 500 are indicated by identical reference numerals except for the first digit of the reference numerals.

Vertical, NPN bipolar transistor 550 comprises a P+ base region 552 extending into epitaxial layer 504, within high voltage tub 514. An N+ emitter region 554 extends into P+ base region 552 from wafer upper surface 524. Base and emitter electrodes 556 and 558, respectively, are situated atop P+ base region 552 and N+ emitter region 554, respectively. The collector region of bipolar transistor 550 is implemented by high voltage tub 514, with N+ buried layer 518 being the chief collector of electrons (not illustrated) that are emitted by N+ emitter region 554, and with N+ high voltage region 516 providing a low resistance path to collector electrode 522.

The breakdown voltage rating of bipolar transistor 550 is determined by the dopant concentration and vertical height of the portion of device region 520 between P base region 552 and N+ buried layer 518. It is preferred that the dopant concentration of device region 520 be the same as that of portion 528 of epitaxial layer 504, whereby regions 520 and 528 can be simultaneously formed so as to reduce the fabrication complexity and cost of semiconductor wafer 500. The fabrication of P+ base region 552, N+ emitter region 554, and electrodes 556 and 558 thereon can advantageously be accomplished using conventional semiconductor device processing techniques. P+ base region 552 can be formed in the same processing step used to form P+ regions 452 and 454 of P-channel MOSFET 450 (FIG. 4), thereby permitting a reduction in fabrication complexity and cost where a P-channel MOSFET (not shown) is also incorporated into semiconductor wafer 500. Similarly, N+ emitter region 554 can be formed in the same processing step used to form N+ regions 352 and 354 of N-channel MOSFET 350 (FIG. 3), thereby simplifying device processing where semiconductor wafer 500 further incorporates an N-channel MOSFET (not shown).

Figure 6:
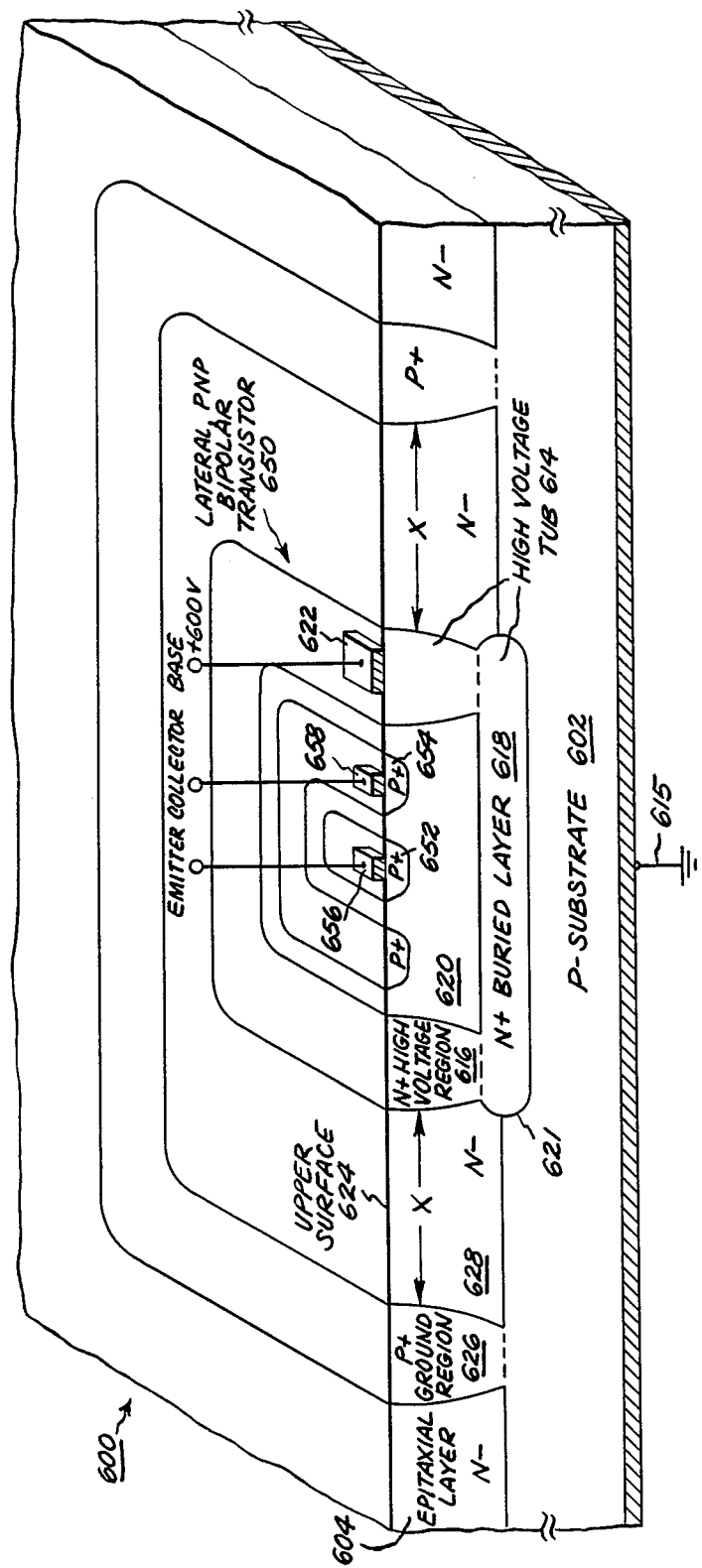
FIG. 6 is a view similar to FIG. 1 depicting a lateral, PNP bipolar transistor at high voltage contained in a semiconductor wafer.

FIG. 6 illustrates a semiconductor wafer 600 including a lateral, PNP bipolar transistor 650 but otherwise being essentially similar to semiconductor wafer 100 (FIG. 1). Accordingly, like parts as between wafers 100 and 500 have identical reference numerals except for the first digit of the reference numerals.

Bipolar transistor 650 includes a P+ emitter region 652 extending into epitaxial layer 604 within high voltage tub 614. A P+ collector region 654 extends into epitaxial layer 604 within high voltage tub 614 and laterally circumscribes P+ emitter region 652. Emitter and collector electrodes 656 and 658, respectively, are disposed atop P+ emitter region 652 and P+ collector region 654, respectively. The base of bipolar transistor 650 is implemented by the combination of N+ high voltage tub 614 and N-device region 620, which preferably is formed simultaneously with N- portion 628 of epitaxial layer 604 to simplify fabrication complexity. P+ emitter region 652 and P+ collector region 654 along with electrodes 656 and 658 thereon, respectively, can advantageously be fabricated using conventional semiconductor device processing technology. P+ emitter region 652 and P+ collector region 654 can be formed in the same processing step used to form P+ regions 452 and 454 of P-channel MOSFET 450 (FIG. 4), thereby permitting a reduction in fabrication complexity and cost where a P-channel MOSFET (not shown) is also incorporated into semiconductor wafer 600.

The foregoing describes various embodiments of a semiconductor wafer incorporating semiconductor devices that are electrically isolated from a substrate of the wafer and from each other by semiconductor material rather than dielectric material as in the prior art. The economy of fabrication of such semiconductor wafers is considerably greater than the economy of fabrication of semiconductor wafers with dielectrically isolated semiconductor devices.

While the invention has been described with respect to specific embodiments by way of illustration, many modifications and changes will occur to those skilled in the art. For example, semiconductor devices complementary to those shown in the Figures could be fabricated wherein P conductivity type material is used in lieu of N conductivity type material and vice-versa. Additionally, any of semiconductor wafers 300 (FIG. 3), 400 (FIG. 4), or 500 (FIG. 5) could be modified to alternatively incorporate a high voltage tub as in semiconductor wafer 200 (FIG. 2). It is, therefore, to be understood that the appended claims are intended to cover the foregoing and all such modifications and changes as fall within the true spirit and scope of the invention.

What is claimed is:

1. A specially configured semiconductor wafer for supporting the isolated high voltage operation of low voltage semiconductor devices comprising:

a substantially planar silicon substrate of one conductivity type;

a layer of opposite conductivity type atop said substantially planar substrate, and having an upper surface;

a heavily doped annular high voltage region of said opposite type conductivity extending from said upper surface into said layer of opposite conductivity type;

a heavily doped substantially planar buried layer of said opposite type conductivity disposed in said layer of opposite conductivity type underlying and substantially coextensive with said annular region;

said annular region and said buried layer substantially enclosing a portion of said layer of opposite conductivity type to define a semiconductor device high voltage operating region;

conductive means contacting said annular high voltage region for referencing the high voltage of said annular high voltage region to the voltage of said semiconductor device operating region;

an annular ground region of said one type conductivity extending from said upper surface into and through said layer of opposite conductivity type to form a continuous one conductivity type region with said substrate, said ground region being laterally separated from said high voltage region by an isolation zone comprised of a portion of said layer of opposite conductivity type, said isolation zone having a lateral dimension X sufficient to provide a selected breakdown isolation potential in excess of 100 volts, wherein X is selected in view of the substrate carrier concentration to provide said breakdown potential, said ground region in combination with said substrate substantially enclosing said high voltage region and said buried layer.

2. The semiconductor wafer of claim 1 wherein said annular high voltage region contacts said buried layer.

3. The semiconductor wafer of claim 1 wherein the plane of said buried layer is substantially parallel to the plane of said substrate and transverse to the major direction of said high voltage region.

4. The semiconductor wafer of claim 3 wherein a MOSFET of said opposite conductivity channel type is formed in said semiconductor device operating region and includes a channel threshold control region, a source electrode electrically shorted to said channel threshold control region, and a drain electrode electrically connected with said conductive means contacting said high voltage region.

5. The semiconductor wafer of claim 3 wherein a MOSFET of said one conductivity channel type is formed in said semiconductor device operating region and includes a source electrode electrically shorted to said conductive means contacting said high voltage region.

6. The semiconductor wafer of claim 5 wherein said MOSFET includes a channel threshold control region of the same conductivity type and dopant concentration as said opposite conductivity type layer, thereby allowing the doping of said channel threshold control region and said opposite conductivity type layer to be accomplished in a single fabrication step.

7. The semiconductor wafer of claim 3 wherein a vertical, bipolar transistor is formed in said semiconductor device operating region, said high voltage region contacting conductive means constituting a collector electrode of said transistor.

8. The semiconductor wafer of claim 3 wherein a lateral, bipolar transistor is formed in said semiconductor device operating region, said high voltage region conducting conductive means constituting a base electrode of said transistor.

9. The semiconductor wafer of claim 1, wherein said isolation zone is lightly doped and said lateral dimension X is approximately 60 microns to provide a breakdown potential in excess of 600 volts.

10. The semiconductor wafer of claim 1 wherein said substrate is lightly doped monocrystalline silicon and prevents breakdown between said buried layer and said substrate.

11. The semiconductor wafer of claim 1 wherein said semiconductor device operating region is lightly doped.

* * * * *